United States Patent
Hsu et al.

(10) Patent No.: US 11,782,338 B2
(45) Date of Patent: *Oct. 10, 2023

(54) EUV PHOTOMASK AND MANUFACTURING METHOD OF THE SAME

(71) Applicant: TAIWAN SEMICONDUCTOR MANUFACTURING COMPANY LTD., Hsinchu (TW)

(72) Inventors: Feng Yuan Hsu, Yilan County (TW); Tran-Hui Shen, Yunlin County (TW); Ching-Hsiang Hsu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/721,758

(22) Filed: Apr. 15, 2022

(65) Prior Publication Data

US 2022/0236637 A1    Jul. 28, 2022

Related U.S. Application Data

(63) Continuation of application No. 16/542,179, filed on Aug. 15, 2019, now Pat. No. 11,307,489.

(60) Provisional application No. 62/724,830, filed on Aug. 30, 2018.

(51) Int. Cl.
*G03F 1/24* (2012.01)

(52) U.S. Cl.
CPC ...................................... *G03F 1/24* (2013.01)

(58) Field of Classification Search
CPC ........................................................ G03F 1/24
USPC ............................................................. 430/5
See application file for complete search history.

(56) References Cited

U.S. PATENT DOCUMENTS 11,307,489 B2 *   4/2022   Hsu ........................... G03F 1/38

* cited by examiner

*Primary Examiner* — Christopher G Young
(74) *Attorney, Agent, or Firm* — WPAT LAW; Anthony King

(57) ABSTRACT

A photomask and a method of manufacturing a photomask are provided. According to an embodiment, a method includes: providing a substrate; depositing a reflective layer over the substrate; depositing a capping layer over the reflective layer; depositing an absorption layer over the capping layer; and treating the reflective layer by a laser beam to form a border region. The borderer region has a reflectivity less than about 0.1%.

20 Claims, 11 Drawing Sheets

EUV PHOTOMASK AND MANUFACTURING METHOD OF THE SAME

PRIORITY CLAIM AND CROSS-REFERENCE

This application is a continuation of U.S. non-provisional application Ser. No. 16/542,179 filed Aug. 15, 2019, and claims priority to U.S. provisional application No. 62/724,830 filed Aug. 30, 2018, the disclosures of which are hereby incorporated by reference in its entirety.

BACKGROUND

In advanced semiconductor technologies, the continuing reduction in device size and increasingly complex circuit arrangements have made the design and fabrication of integrated circuits (ICs) more challenging and costly. To pursue better device performance with smaller footprint and less power, advanced lithography technologies, e.g., extreme ultraviolet (EUV) lithography, have been investigated as approaches to manufacturing semiconductor devices with a line width of 30 nm or less. EUV lithography employs a photomask to control the irradiation of a substrate under EUV radiation so as to form a pattern on the substrate.

While existing lithography techniques have improved, they still fail to meet requirements in many aspects. For example, contamination by foreign particles during the EUV lithography process continues to raise significant issues.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
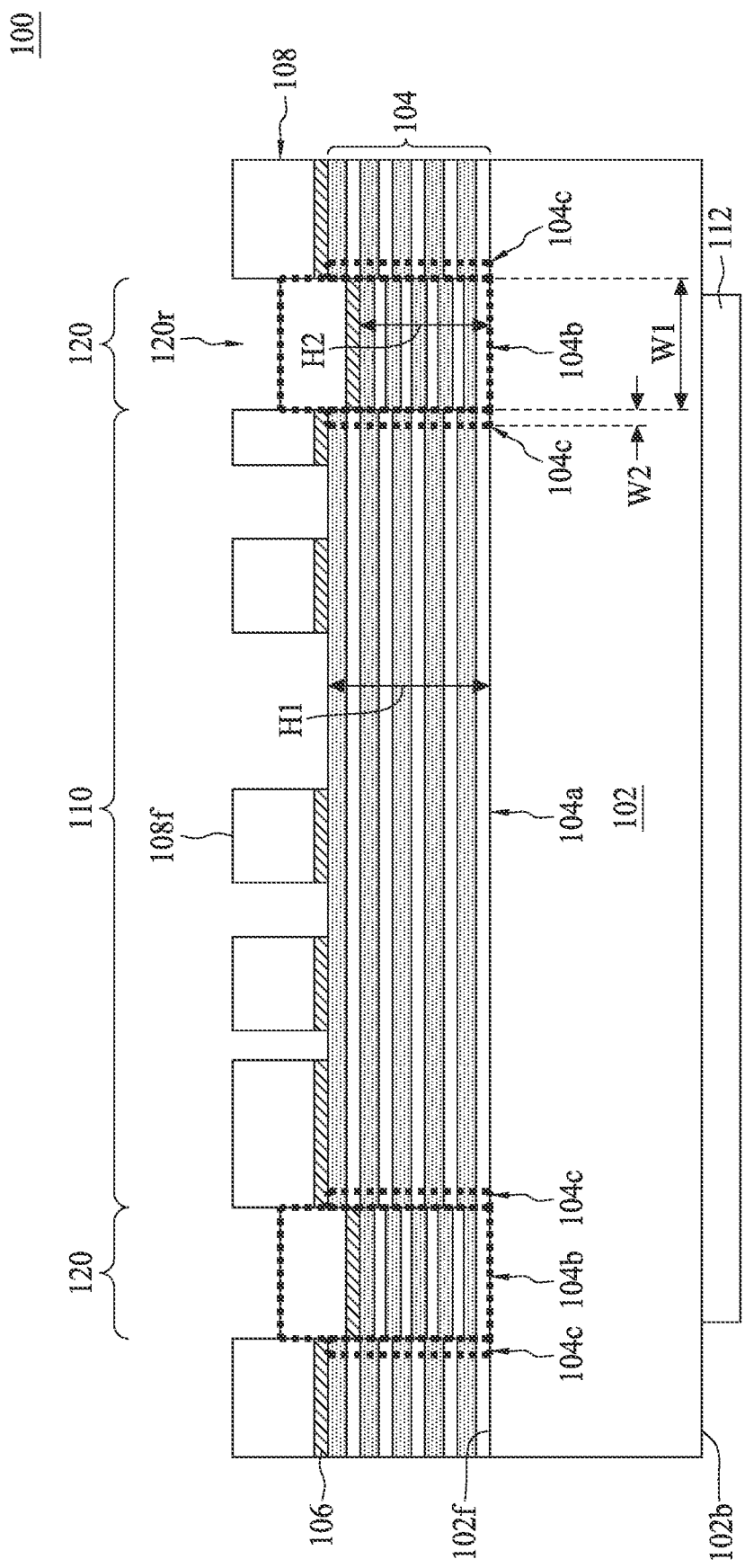
FIGS. 1A and 1B are a cross-sectional view and a top view, respectively, of a photomask, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 70 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" and "substantially" generally mean within 10%, 5%, 1% or 0.5% of a given value or range. Alternatively, the terms "about," "substantial" and "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

An extreme ultraviolet (EUV) photomask is typically a reflective mask that includes circuit patterns and transfers the patterned EUV radiation onto the wafer through reflection of incident EUV radiation. The layout of the EUV photomask includes an imaging region in which the circuit pattern is disposed and a border region defining and surrounding the imaging region. An additional function of the border region is to serve as an EUV blocking area in order to confine EUV radiation within the imaging region and to prevent neighboring unexposed regions in the wafer from being doubly exposed.

The present disclosure provides an EUV photomask and a method of manufacturing the EUV photomask. In the proposed EUV photomask, the border region is constructed with a solid structure of low EUV reflectivity instead of a hollow space. A relatively sharp boundary between the imaging region and the border region can be achieved by applying an ultrafast laser treatment with tuned laser treatment parameters. The ultrafast laser may have a relatively short pulse duration less than one nanosecond with a high intensity and is capable of forming light-shielding structures in the border region while keeping the undesired heat-affected zones minimized. As a result, the occupied area of the border region can be reduced as much as possible and the usable area of the imaging region can be maximized. The issue of debris-induced contamination is thus mitigated since no etching is required to form the border region. The cost and cycle time of one more lithographic operation of etching trenches for obtaining a low-reflectivity border region is also avoided. Moreover, the aerial image contrast of the pattern around the die edge can be maintained as desired and the control of critical dimension can be improved.

Figure 1B:
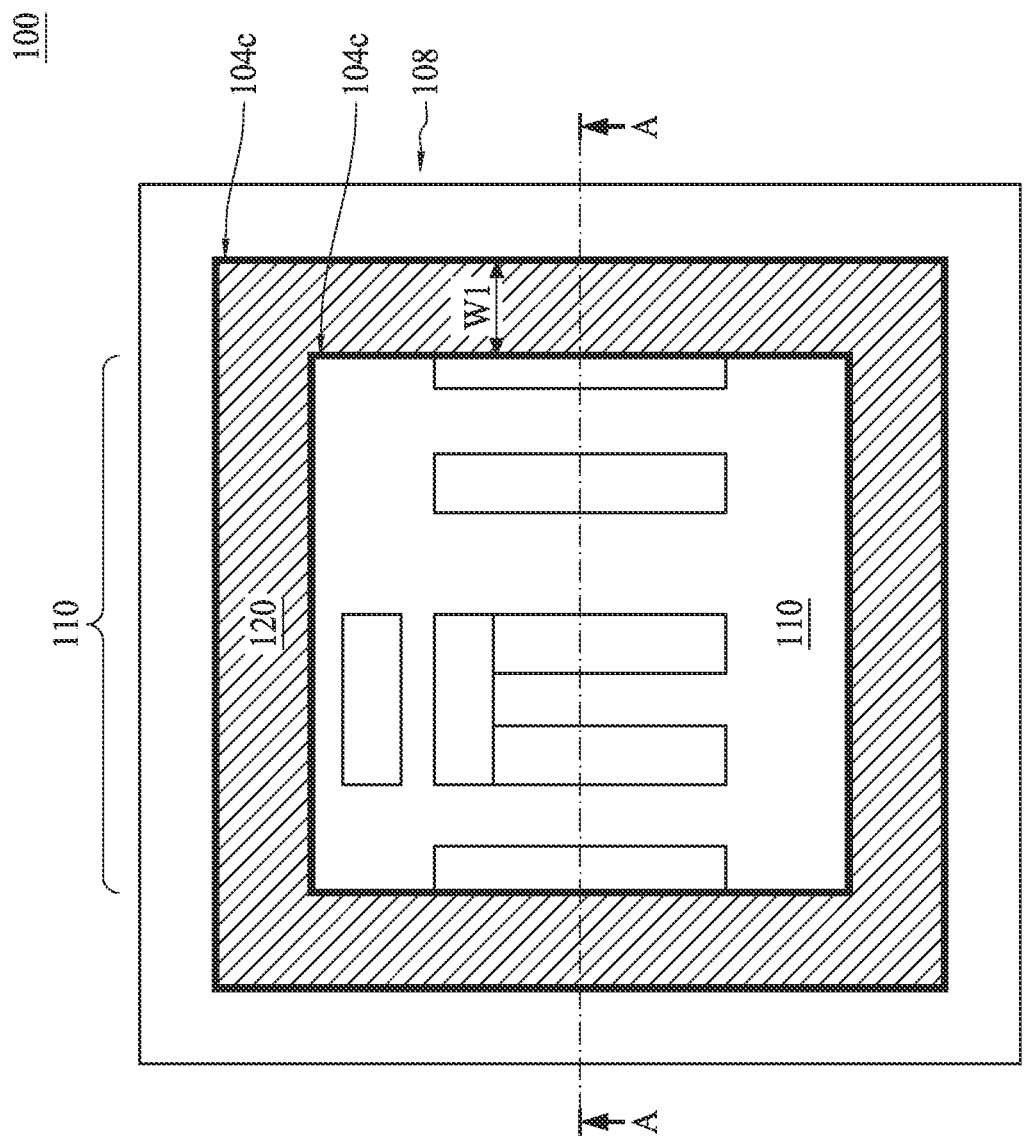

FIGS. 1A and 1B are a cross-sectional view and a top view, respectively, of a photomask 100, in accordance with some embodiments. FIG. 1A is a view along sectional lines AA in FIG. 1B. The photomask 100 may be used for performing EUV lithography operations, i.e., it is compatible with a radiation source having a wavelength between about 1 nm and 100 nm, e.g., 13.5 nm. However, the photomask 100 can also be used in lithography operations using other wavelengths, such as deep UV (DUV) or other suitable radiation sources. The photomask 100 is typically constructed as a reflective mask, in which a patterning radiation for a wafer is formed through reflection of incident radiation via the photomask 100. Referring to FIG. 1A, the photomask 100 includes a substrate 102, a multilayer stack 104, a capping layer 106 and an absorption layer 108.

The substrate 102 is formed of a low thermal expansion (LTE) material, such as fused silica, fused quartz, silicon, silicon carbide, black diamond and other low thermal expansion substances. In some embodiments, the substrate 102 serves to reduce image distortion resulting from mask heating. In the present embodiment, the substrate 102 includes material properties of a low defect level and a smooth surface. In some embodiments, the substrate 102 transmits light at a predetermined spectrum, such as visible wavelengths, infrared wavelengths near the visible spectrum (near-infrared), and ultraviolet wavelengths. In some embodiments, the substrate 102 absorbs EUV wavelengths and DUV wavelengths near the EUV wavelengths. In some embodiments, the substrate 102 has an area of 32 mm×26 mm and a thickness of about 20 mm.

The multilayer stack 104 is formed over a front side 102f of the substrate 102. The multilayer stack 104 is configured to form a reflective layer of the photomask 100. The multilayer stack 104 may include pairs wherein each pair is formed of a molybdenum (Mo) layer and a silicon (Si) layer (not separately shown, but are illustrated in FIGS. 2A to 2G). The number of alternating Mo layers and Si layers (i.e., the number of Mo/Si pairs) and the thicknesses of the Mo layers and the Si layers are determined so as to facilitate constructive interference of individual reflected rays and thus increase the reflectivity of the multilayer stack 104. In some embodiments, the reflectivity of the multilayer stack 104 is higher than about 60% for wavelengths of interest e.g., 13.5 nm. In some embodiments, the number of Mo/Si pairs in the multilayer stack 104 is between about 20 and about 80, e.g., 40. Further, in some embodiments, each of the Mo layers and each of the Si layers has a thickness between about 2 nm and about 10 nm, e.g., 7 nm. In some embodiments, the layers of Si and Mo have substantially the same thicknesses. In alternative embodiments, the Si layers and the Mo layers have different thicknesses. The Si and Mo layers may be formed by physical vapor deposition (PVD), chemical vapor deposition (CVD), plasma-enhanced CVD (PECVD), atomic layer deposition (ALD), or any other suitable process.

In some other embodiments, the multilayer stack 104 includes alternating Mo layers and beryllium (Be) layers. The number of Mo/Be pairs in the multilayer stack 104 may be in a range from about 20 to about 100, and each Mo layer or Be layer may have a thickness between about 1 nm and about 12 nm, although other numbers of layers and other thicknesses may be desirable for increasing reflectivity. In some embodiments, the reflectivity is higher than about 60% for wavelengths of interest e.g., 13.5 nm.

The capping layer 106 is disposed over the multilayer stack 104. In some embodiments, the capping layer 106 is used to prevent oxidation of the multilayer stack 104 during a mask patterning process. In some embodiments, the capping layer 20 is made of ruthenium (Ru). Other capping layer materials, such as silicon dioxide ($SiO_2$), amorphous carbon or other suitable compositions, can also be used in the capping layer 106. The capping layer 106 may have a thickness between about 1 nm and about 10 nm. In certain embodiments, the thickness of the capping layer 106 is between about 2 nm and about 4 nm. In some embodiments, the capping layer 106 is formed by PVD, CVD, low-temperature CVD (LTCVD), ALD or any other suitable film-forming method.

The absorption layer 108 is disposed over the capping layer 106. The absorption layer 108 absorbs radiation in the EUV wavelength ranges projected onto the photomask 100. The absorption layer 108 may include chromium, chromium oxide, titanium nitride, tantalum nitride, tantalum oxide, tantalum boron nitride, tantalum, titanium, aluminum-copper, combinations thereof, or the like. The absorption layer 108 may be formed of a single layer or of multiple layers. For example, the absorption layer 108 includes a chromium layer and a tantalum nitride layer. In some embodiments, the absorption layer 108 has a thickness in a range from about 10 nm to about 100 nm. In certain embodiments, the absorption layer 108 has a thickness in a range from about 40 nm to about 80 nm, e.g., 70 nm. In some embodiments, the absorption layer 108 is formed by PVD, CVD, LTCVD, ALD or any other suitable film-forming method.

The absorption layer 108 includes circuit patterns to be transferred to the wafer. Some portions of the absorption layer 108 cover the capping layer 106 while some other portions of the absorption layer 108 expose the capping layer 106. During a lithographic operation, part of the radiation beam impinging on the photomask 100 is shielded by the absorption layer 108 to form a patterned radiation beam that functions to pattern the wafer.

In some embodiments, an antireflective layer (not shown) is disposed over the absorption layer 108. The antireflective layer may reduce reflection of the impinging radiation having a wavelength shorter than the DUV range from the absorption layer 108, and may include a same pattern as the underlying absorption layer 108. The antireflective layer may be a TaBO layer having a thickness between about 12 nm and about 18 nm. Other materials, such as $Cr_2O_3$, ITO, SiN and $TaO_5$ may also be used. In other embodiments, a silicon oxide film having a thickness between about 2 nm and about 10 nm is adopted as the antireflective layer. In some embodiments, the antireflective layer is formed by PVD, CVD, LTCVD, ALD, or any other suitable film-forming method.

In some embodiments, the photomask 100 further includes a conductive layer 112 on a backside 102b of the substrate 102. The conductive layer 112 may aid in engaging the photomask 100 with an electric chucking mechanism (not separately shown) in a lithography system. In some embodiments, the conductive layer 112 includes chromium nitride (CrN), chromium oxynitride (CrON), or another suitable conductive material. In some embodiments, the conductive layer 112 includes a thickness in a range from about 50 nm to about 400 nm. The conductive layer 112 may have a surface area less than the surface area of the substrate 102. The conductive layer 112 may form an indentation from a sidewall of the substrate 102. In some embodiments, the conductive layer 112 has a length or width in a range between 70% and 95% of a length or a width, respectively, of the substrate 102. The conductive layer 112 is formed by CVD, ALD, molecular beam epitaxy (MBE), PVD, pulsed laser deposition, electron-beam evaporation, ion beam assisted evaporation, or any other suitable film-forming method.

Still referring to FIG. 1A, the photomask 100 includes an imaging region 110 and a border region 120 defining and surrounding the imaging region 110. The border region 120 may be spaced apart from the edge of the photomask by a gap as illustrate in FIG. 1A. Alternatively, the border region 120 may extend to the edge of the photomask 100. A wafer to be patterned is generally partitioned into several die fields of identical sizes. During a die patterning procedure, the wafer is moved into the lithography system and shifted by a stepper to align one target die field in the wafer with the imaging region 110, followed by a scanning step in which the target die field is subjected to the patterning radiation beam from a radiation source (not shown) and through the photomask 100. The die patterning procedure is repeated until all of the die fields are completed. Referring to FIG. 1B, the border region 120 has a rectangular ring shape surrounding the imaging region 110; however, other border region shapes, e.g., an annular ring or other suitable shapes, are also possible. The border region 120 also serves to prevent excess radiation around the boundary of the imaging region 110 from leaking into adjacent die fields of the wafer. As a result, no double exposure will occur around the boundary areas of each die field, and a precise exposure dose control and high aerial image contrast can be achieved. To this end, the reflectivity ratio between the imaging region 110 and the border region 120 should be made as large as possible. A lowest reflectivity of the border region 120 is also desirable. In an embodiment, the border region 120 has a reflectivity lower than about 0.1%. In an embodiment, the border region 120 has a reflectivity lower than about 0.05%, e.g., 0.01%.

Referring back to FIG. 1A, both of the imaging region 110 and the border region 120 include the constituting layers of the photomask 100, i.e., the substrate 102, the multilayer stack 104, the capping layer 106 and the absorption layer 108. The difference between the imaging region 110 and the border region 120 lies in the thickness or composition of the two regions 110 and 120. The multilayer stack 104 has a first portion 104a in the imaging region 110 and a second portion 104b in the border region 120, wherein the second portion 104b is thinner than the first portion 104a. In some embodiments, the number of Si layers and the number of Mo layers in the second portion 104b are identical to those in the first portion 104a, and the thickness of each Mo layer or each Si layer in the second portion 104b is less than that of the corresponding Mo layer or Si layer in the first portion 104a. As a result, a height H2 of the second portion 104b is less than a height H1 of the first portion 104a. The smaller thickness of the multilayer stack 104 in the second portion 104b may cause the second portion 104b to lose at least part of the property to successfully produce constructive interference of the superimposed reflected radiation rays. As a consequence, the reflection behavior of the second portion 104b is different from that of the first portion 140a (which maintains the desirable constructive interference thickness), and thus the reflectivity of the multilayer stack 104 in the second portion 104b, i.e., in the border region 120, is significantly decreased as compared to the first portion 104a, i.e., in the imaging region 110.

In some embodiments, a ratio of the height H2 to the height H1 is in a range between 50% and 95%. In some embodiments, a ratio of the height H2 to the height H1 is in a range between 70% and 85%. In some embodiments, a thickness ratio of the Mo layer or Si layer in the second portion 104b to the corresponding Mo layer or Si layer in the first portion 104a is in a range between 70% and 85%. In some embodiments, each of the Mo layers or Si layers in the second portion 104b has a thickness between 1 nm and about 9 nm. In some embodiments, each of the Mo layers or Si layers in the second portion 104b has a thickness between 2 nm and about 7 nm, e.g., 5 nm.

In some embodiments, the multilayer stack 104 has different compositions in the non-reduced first portion 104a and the reduced second portion 104b. While the first portion 104a is formed of alternatingly disposed Mo layers and Si layers formed of Mo atoms and Si atoms, respectively, the second portion 104b may further include a compound of Mo and Si in addition to Mo atoms and Si atoms, such as molybdenum silicide ($MoSi_2$ or MoSi). In some embodiments, the Mo/Si compound may exist near the interface between the Mo layer and Si layer. In some embodiments, the formation of the Mo/Si compound enables inter-diffusion of the atoms in the Mo layers and Si layers into compounds and leads to a reduced size of the Mo/Si multilayer stack 104.

The aforementioned compound of Mo/Si atoms may be formed by an annealing operation, such as laser treatment. In the present disclosure, an ultrafast laser treatment is proposed in which a pulsed laser with an ultra-short pulse duration, e.g., less than one nanosecond, and an ultra-high intensity is employed. The pulsed ultra-short laser is projected onto the second portion 104b with a laser power sufficient to enable compound formation, such as molybdenum silicide molecules. Further, the annealing power of the laser treatment is limited to below an ablation threshold such that the Mo layer or the Si layer in the second portion 104b is neither damaged nor ablated by the laser treatment. In some embodiments, the substrate 102, the capping layer 106 and the absorption layer 108 are neither damaged nor ablated during the laser treatment. In some embodiments, the thicknesses of the substrate 102, the capping layer 106 and the absorption layer 108 are kept substantially equal in the imaging region 110 and the border region 120 during the treatment. In some embodiments, no new compound is formed in the substrate 102, the capping layer 106 or the absorption layer 108 by the laser treatment on the multilayer stack 104.

With the ultrafast laser treatment, the width of the border region 120 can be made as small as possible while meeting the requirement of preventing radiation from leaking to adjacent die fields. A transition zone 104c may exist between the fully-treated reduced area of the second portion 104b and the non-treated area of the first portion 104a, in which EUV reflectivity of the transition zone 104c is in an intermediate range, e.g., from about 20% to about 50%, between the low and high reflectivity values of 0.05% and 60% for the second portion 104b and the first portion 104a, respectively. In some embodiments, the transition zone 104c comprise a reflectivity value less than a reflectivity value of the first portion 104a and greater than a reflectivity value of the second portion 104b. Such transition zone may be deemed a waste of the photomask resource and should be minimized. According to an embodiment of the present embodiment, a width W1 of the border region 120 may be in a range from about 50 µm to about 200 µm. In some embodiments, the transition zone 104c has a width W2 less than about 15 µm. In some embodiments, the transition zone 104c has the width W2 less than about 10 µm, such as in a range from 5 µm to 10 µm, or from 1 µm to 10 µm, or from 1 µm to 5 µm, such as 2 µm. The area efficiency of the border region 120 is thus maintained. In an embodiment, a width ratio W2/W1 is between about 0.005 and about 0.1. In an embodiment, a width ratio W2/W1 is between about 0.01 and about 0.05.

As discussed previously, the ultrafast laser treatment is controlled to allow formation of a compound from atoms, e.g., Mo and Si atoms, in the multilayer stack 104 while preventing the atoms of the Mo layers and Si layers from being damaged or ablated. No etching operation or similar processes are used during the formation of the border region 120. Also, the laser treatment creates a recess 120r on a top surface 108f of the absorption layer 108 due to shrinkage of the multilayer stack 104, instead of etching a deep trench through the absorption layer 108, the capping layer 106 and the multilayer stack 104. A depth of the recess 120r may be between about 20 nm and about 70 nm. Such depth is contributed from the reduction of the multilayer stack 104 because the thickness of the capping layer 106, the absorption layer 108 or the substrate 102 is substantially maintained. In some embodiments, the recess 120r may have a depth less than the thickness of the absorption layer 108 in some other embodiments. The proposed border region 120 is advantageous in that the likelihood of trapping foreign particles, debris or dust within the recess 120r is reduced or eliminated. The effectiveness of photomask defect inspection and cleaning is thus made easier and more efficient.

FIGS. 2A to 2G are cross-sectional views of intermediate stages of a method of manufacturing a photomask 200, in accordance with some embodiments. The completed photomask 200 may be similar to the photomask 100 in FIG. 1A. It should be understood that additional operations can be provided before, during, and after the processes shown in FIGS. 2A to 2G, and some of the operations described below can be replaced or eliminated, for additional embodiments of the method. The order of the operations/processes may be changed. Materials, configurations, dimensions, processes and/or operations the same as or similar to those described with respect to the foregoing embodiments may be employed in the following embodiments and the detailed explanation thereof may be omitted.

Figure 2A:
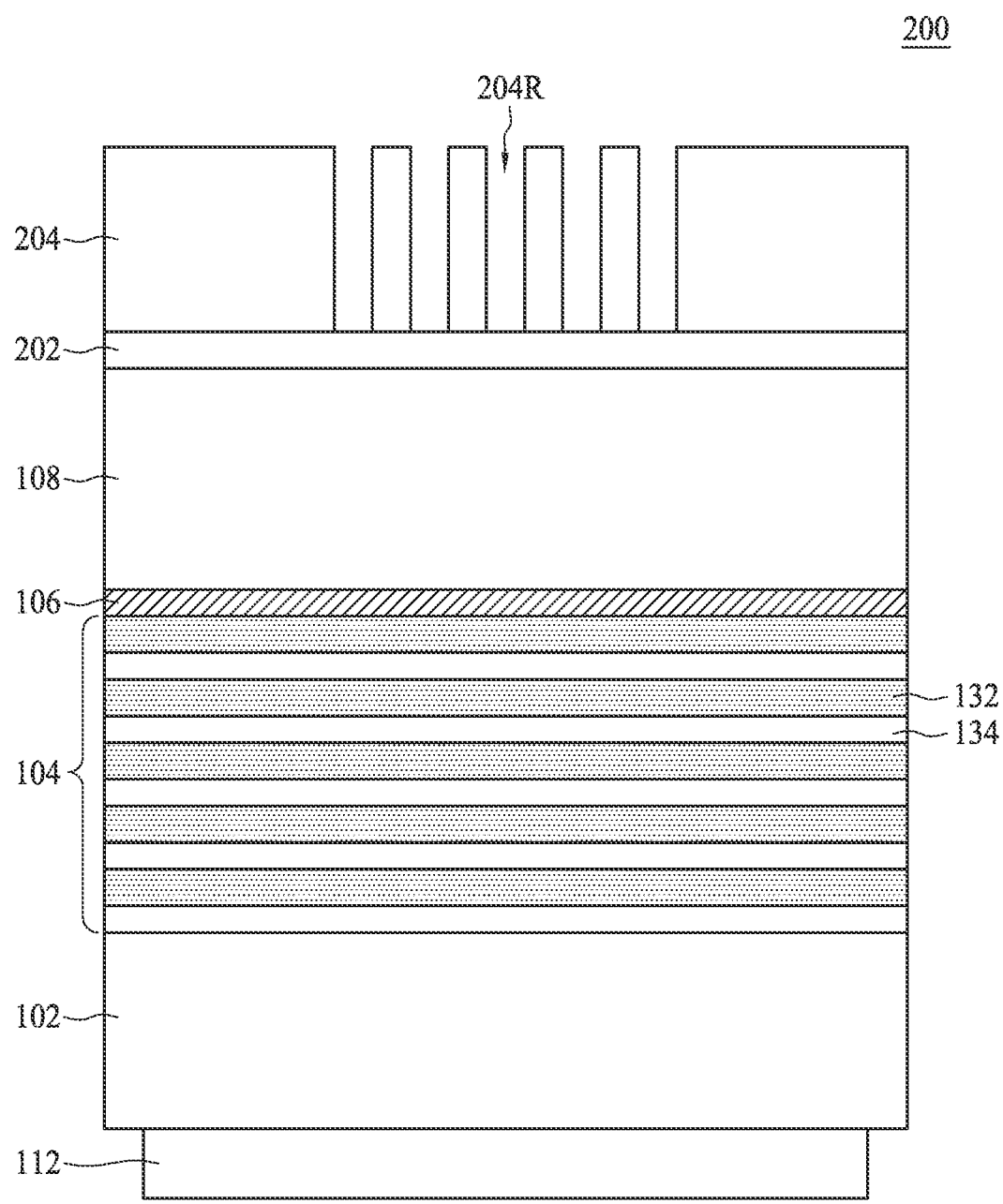
FIGS. 2A to 2G are cross-sectional views of intermediate stages of a method of manufacturing a photomask, in accordance with some embodiments.

Referring to FIG. 2A, a stack of multiple layers including the conductive layer 112, the substrate 102, the multilayer stack 104, the capping layer 106 and the absorption layer 108 is provided. For example, the substrate 102 is initially provided or formed. The multilayer stack 104 is deposited over the substrate 102 by alternatingly forming a single Mo layer 132 and a single Si layer 134, or vice versa, over one another until the predetermined number of Mo/Si layer pairs is reached. In an embodiment, the multilayer stack 104 includes a silicon layer as a bottom layer contacting the substrate 102. Subsequently, the capping layer 106 is deposited over the as-formed multilayer stack 104. The absorption layer 108 is deposited over the capping layer 106. Each of the aforementioned layers can be formed in a blanket manner over one another. In some embodiments, an antireflective layer is formed over the absorption layer 108. The conductive layer 112 may be formed on a backside of the substrate 102. In an embodiment, an etching operation is performed to remove a peripheral portion of the conductive layer 112 so that an indentation of the conductive layer 112 with respect to the substrate 102 is formed.

In some embodiments, a mask layer 202 is disposed over the absorption layer 108. In embodiments where the antireflective layer is present over the absorption layer 108, the mask layer 202 is formed over the antireflective layer. In some embodiments, the mask layer 202 is a hard mask layer and may be made of silicon, a silicon-based compound, chromium, or a chromium-based compound. In some embodiments, the chromium-based compound includes chromium oxide, chromium nitride, chromium oxynitride, or the like. In other embodiments, TaO, TaN, Ru, RuB, TaB, TaBN or TaBO is used as the hard mask layer 30. In some embodiments, the mask layer 202 has a thickness between about 4 nm and about 20 nm.

The forming method of the aforementioned layers may include CVD, ALD, PVD, sputtering, thermal oxidation, atmosphere pressure CVD (APCVD), low-pressure CVD (LPCVD), low-temperature CVD (LTCVD), laser-enhanced CVD (LECVD), plasma-enhanced CVD (PECVD), thermal evaporation, pulsed laser evaporation, electron beam evaporation, molecule beam epitaxy, ion beam-assisted evaporation, or the like.

A photoresist layer 204 is deposited over the mask layer 202. The photoresist layer 204 may be formed of a photosensitive material or other suitable resist materials. The photoresist layer 204 may be deposited over the mask layer 202 by CVD, ALD, PVD, spin-on coating, or other suitable film-forming method. Once formed, the photoresist layer 204 is patterned according to a predetermined circuit pattern. Patterning of the photoresist layer 204 may include a maskless exposure such as electron-beam writing, and ion-beam writing, developing the photoresist layer 204 and etching unwanted portions of the photoresist layer 204. Openings 204R are formed through the patterning operations.

Figure 2B:
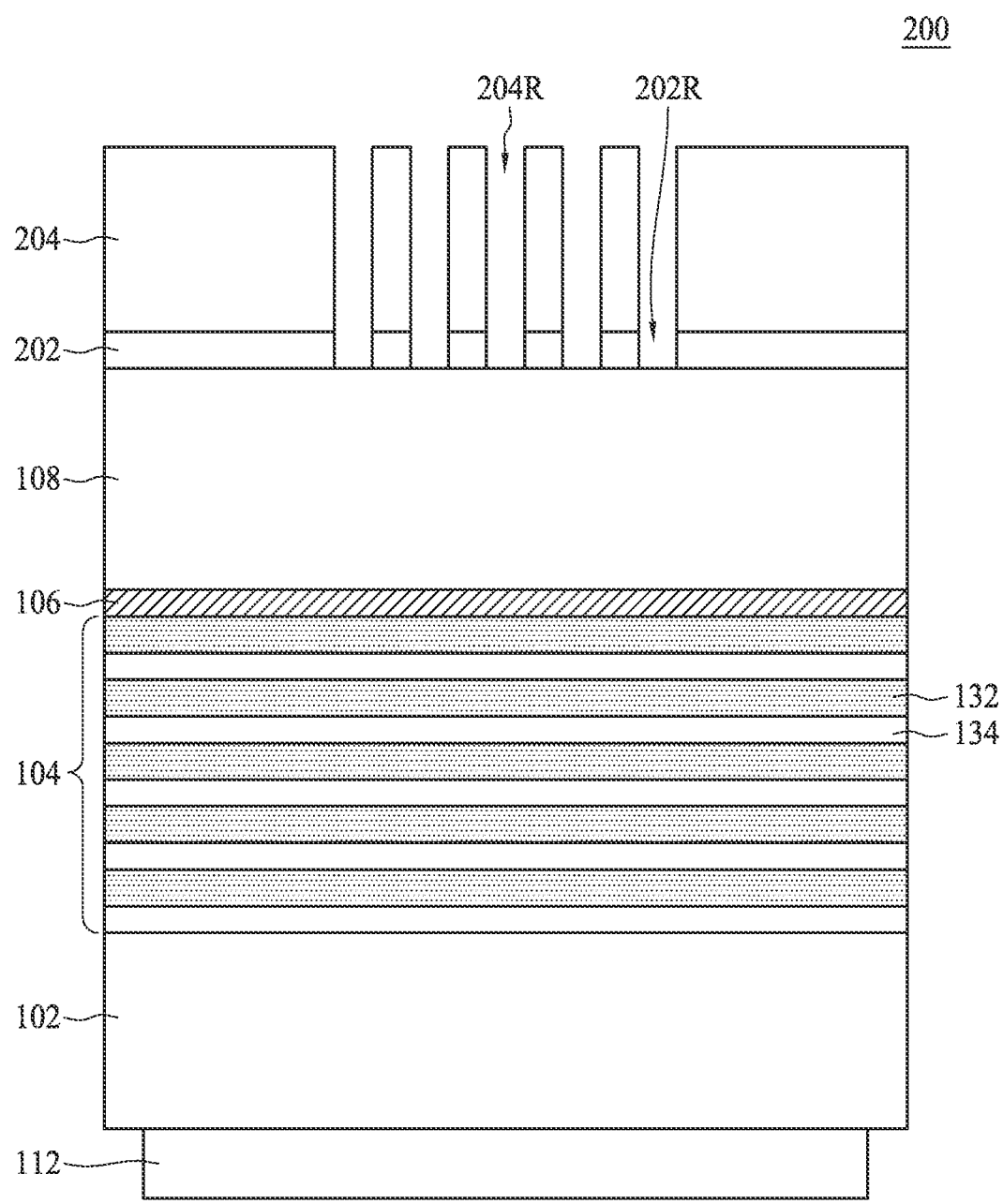
Figure 2C:
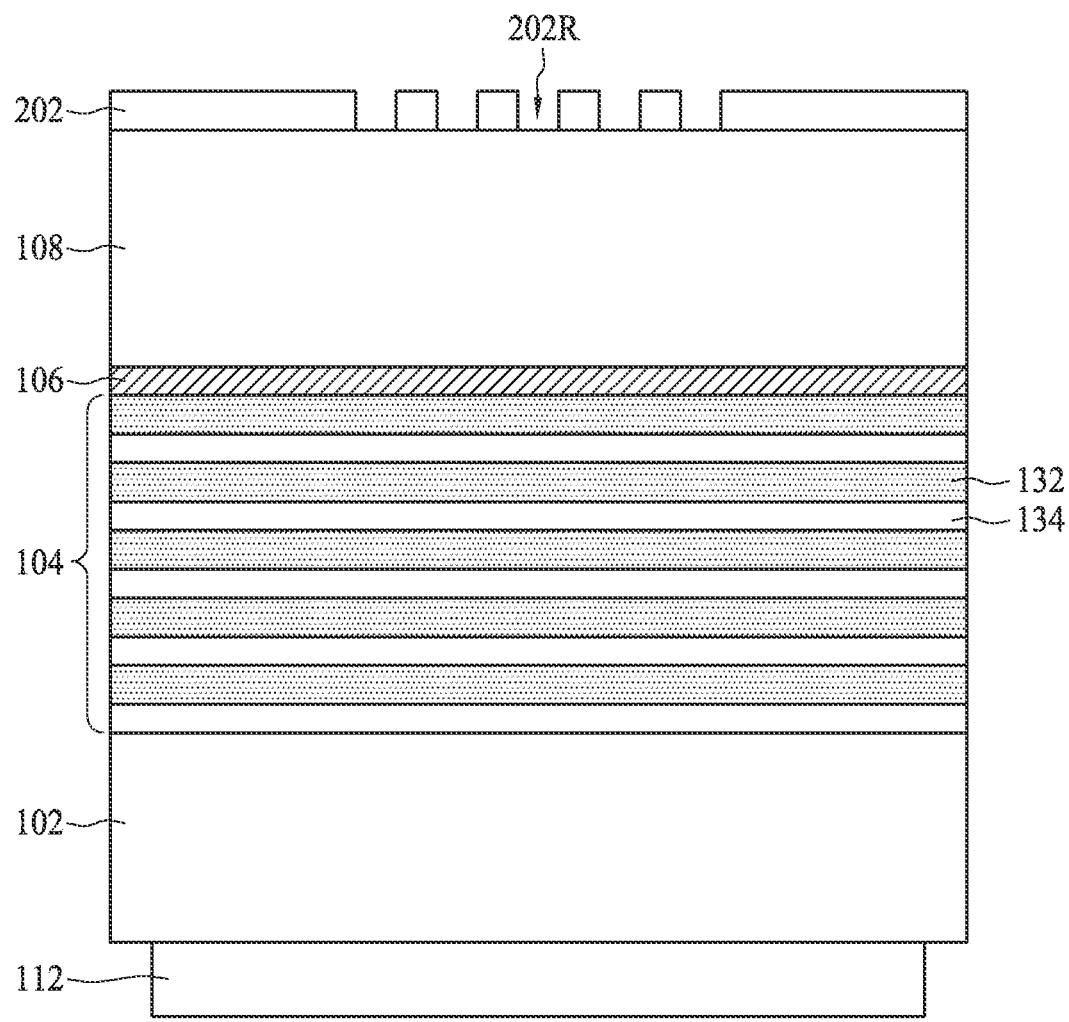

FIG. 2B shows subsequent patterning of the mask layer 202 according to the patterned photoresist layer 204. Patterning operations of the mask layer 202 may include performing photolithography and etching steps on the mask layer 202 to form openings 202R with the patterned photoresist layer 204 as an etching mask. The openings 202R are formed as downward extensions of the openings 204R that run through the mask layer 202 and expose the absorption layer 108. An exemplary patterning process includes photomask aligning, exposing and developing the mask layer 202, and etching of the mask layer 202. Next, the photoresist layer 204 is removed in FIG. 2C. The removal operations may include an etching or ashing operation.

Figure 2D:
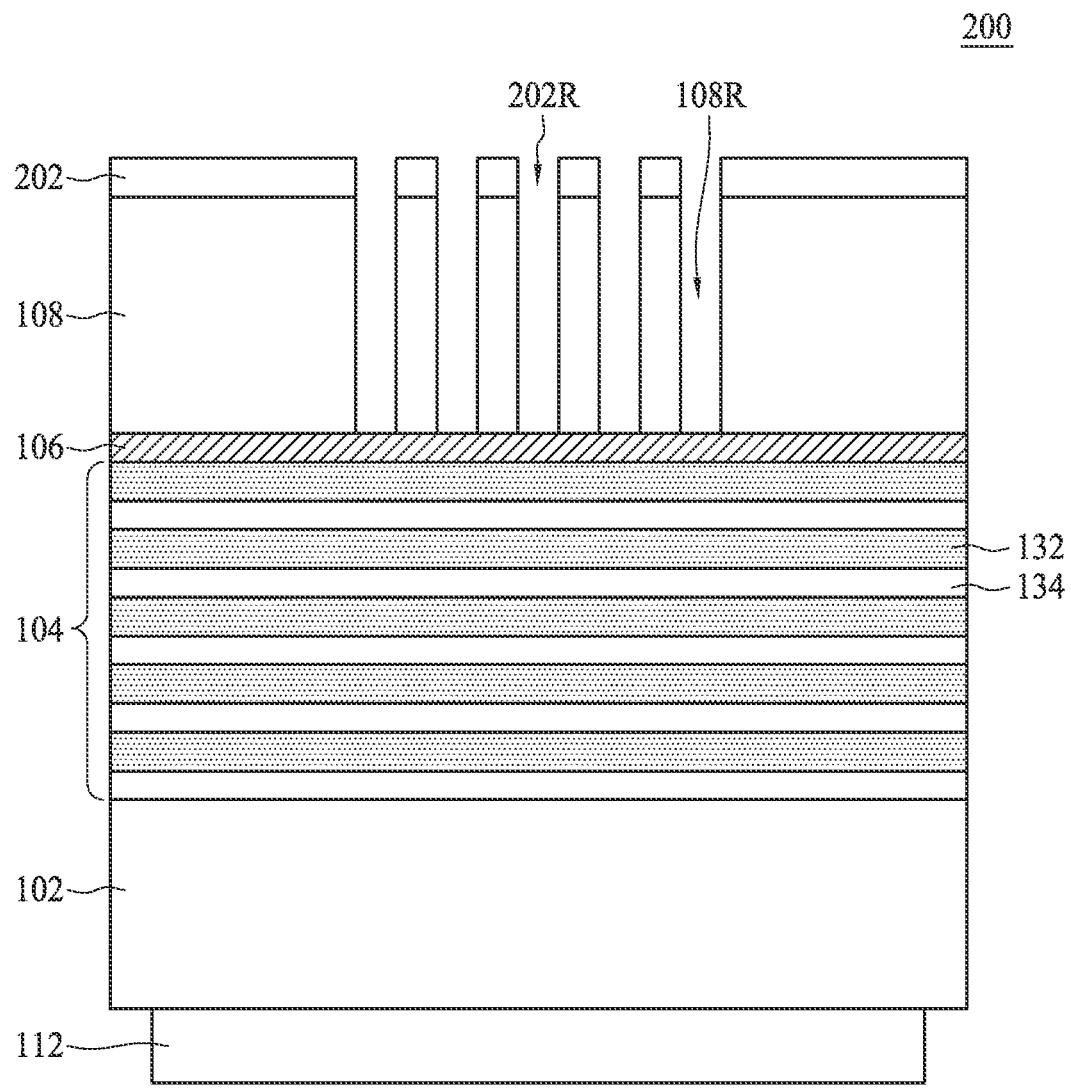

In FIG. 2D, the absorption layer 108 is patterned according to the patterned mask layer 202. Patterning operations of the absorption layer 108 may include performing photolithography and etching steps on the absorption layer 108 to form openings 108R with the mask layer 202 as etching mask. The openings 108R are formed as downward extensions of the openings 202R that extend through the absorption layer 108 and expose the capping layer 106. An exemplary patterning process includes photomask aligning, exposing and developing the absorption layer 108, and etching of the absorption layer 108. In some embodiments, the mask layer 202 is removed after the absorption layer 108 has been patterned. The removal operations may include an etching or ashing operation. The patterns in the absorption layer 108, i.e., openings 108R, are formed within the imaging region, e.g., the imaging region 110 shown in FIG. 1A.

Figure 2E:
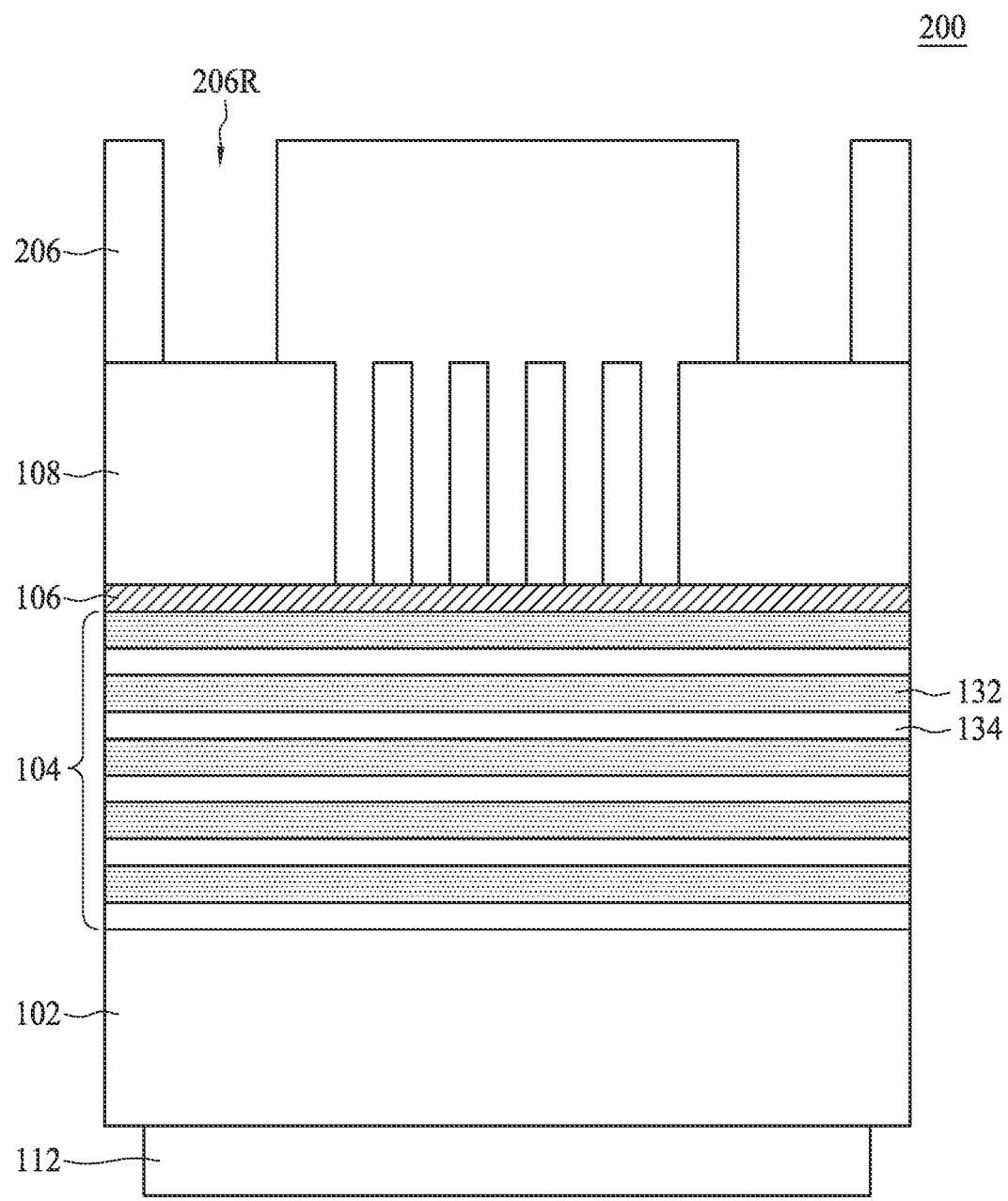
Figure 2F:
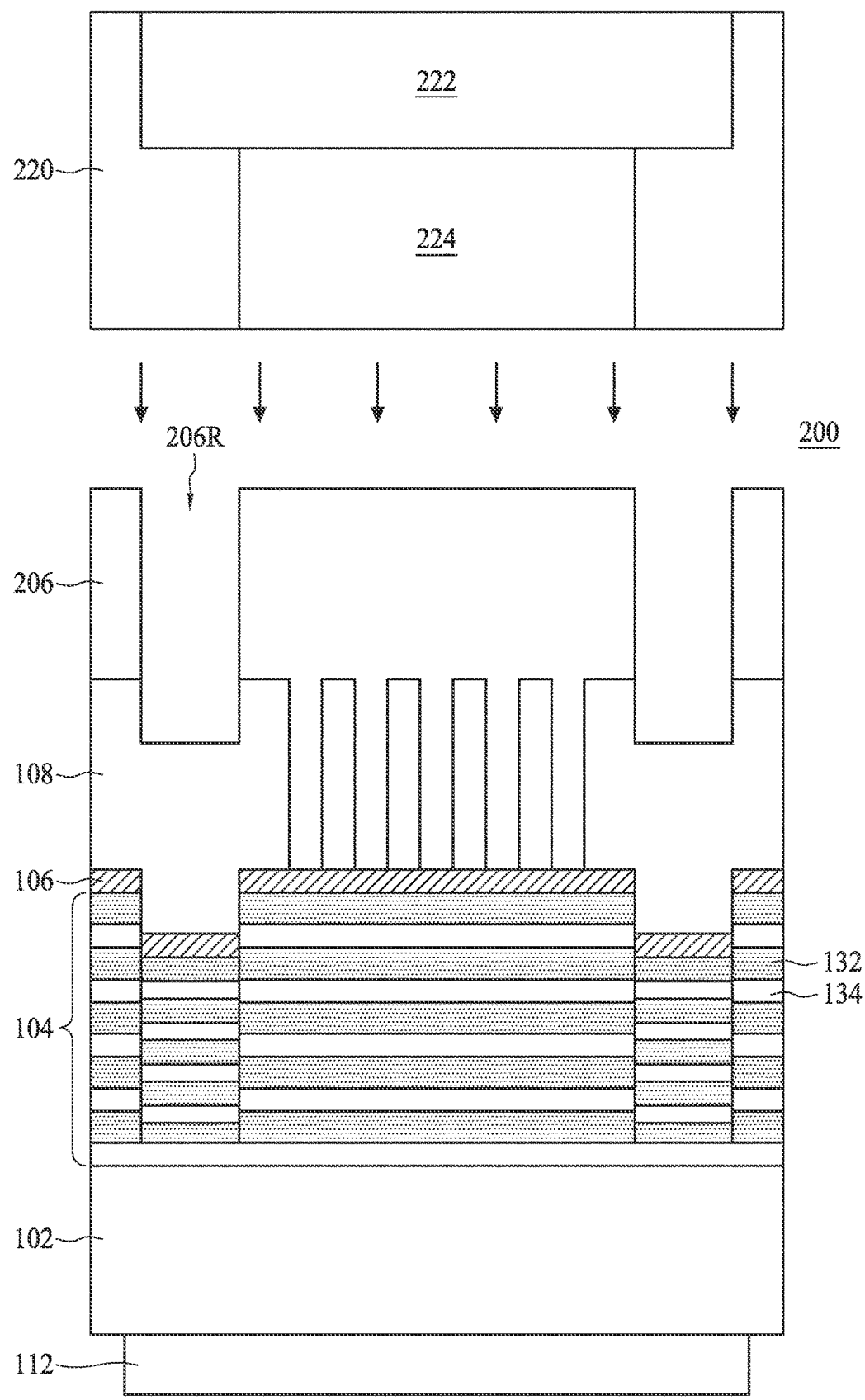
Figure 2G:
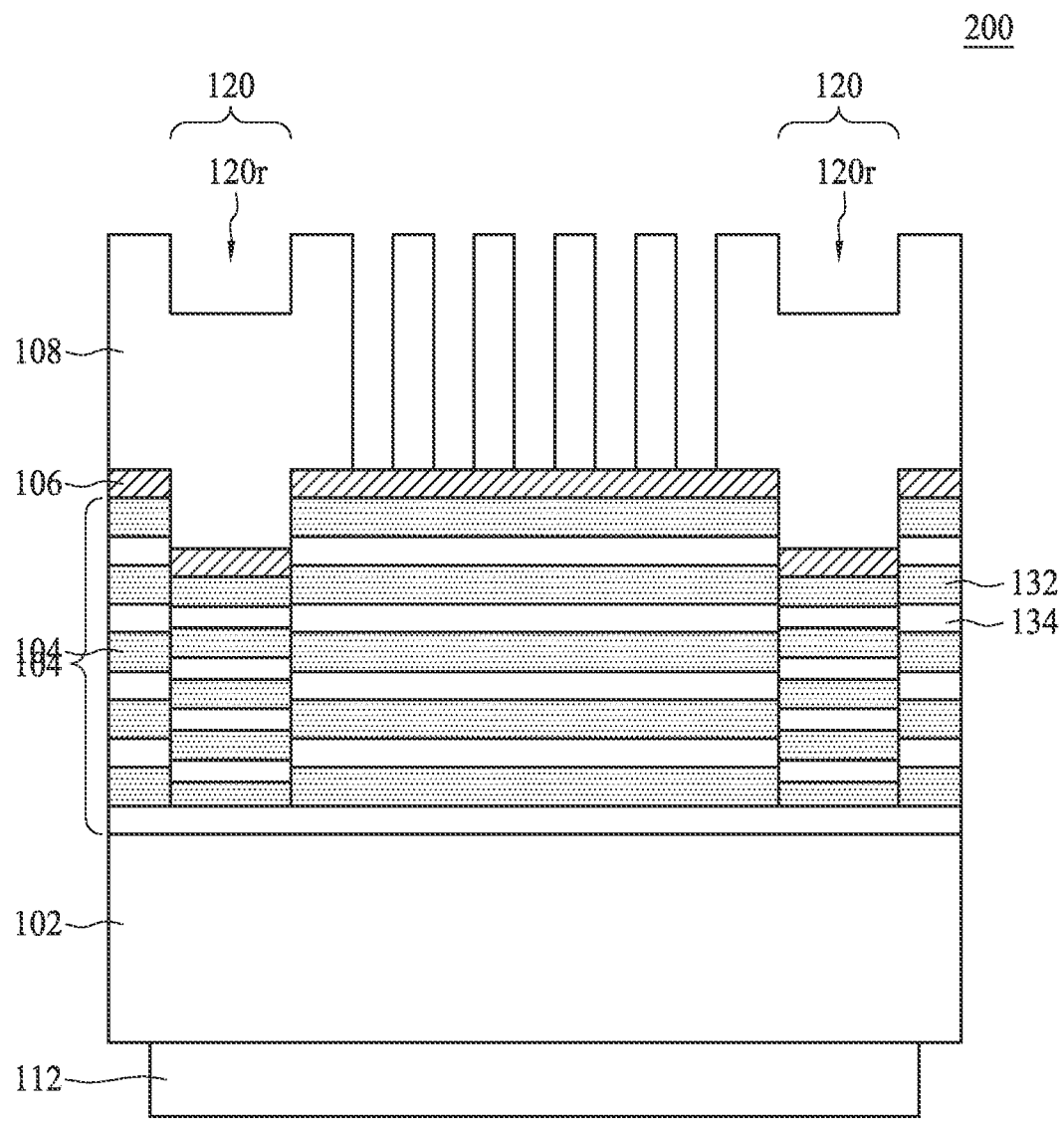

FIGS. 2E to 2G illustrate the forming of border regions 120. Initially, a photoresist layer 206 is deposited over the patterned absorption layer 108 in FIG. 2E. The photoresist layer 206 may be formed of a photosensitive material or other suitable resist materials. The photoresist layer 206 may include a material the same as or different from that of the photoresist layer 204. The photoresist layer 206 may be deposited over the absorption layer 108 by CVD, ALD, PVD, spin-on coating, or other suitable film-forming method. The photoresist layer 206 may fill the openings 108R. Once formed, the photoresist layer 206 is patterned where the border regions 120 are situated. Patterning of the photoresist layer 206 may include a mask-based or mask-less exposure, developing the photoresist layer 204 and etching unwanted portions of the photoresist layer 206. Openings 206R are formed through the patterning operations.

Referring to FIG. 2F, a laser treatment is performed on the photomask 200. In some embodiments, a laser system 220 is utilized to project a laser beam onto the photomask 200. The laser system 220 may include a laser source 222 and a projection module 224. The laser source 222 may be configured to emit a laser beam to the photomask 200 through the projection module 224 with the patterned photoresist layer 206 as mask. The laser system 220 is controlled to project the ultrafast laser beam to form the border region 120 in the multilayer stack 104. As a result, the reduced border regions 120 are formed directly below the openings 206R by the laser treatment.

The parameters of the ultrafast laser produced by the laser system 220 determine the performance of the border region 120, and major control parameters at least include power, pulse duration, pulse frequency, and beam profile. A proper coordination of laser power, pulse duration, pulse frequency and the beam profile can stimulate successful generation of molecular compounds of Mo/Si layers in the second portion 104b of the multilayer stack 104 within the border region 120 while keeping the heat-affected zone or transition zone (referred to as zone 104c in FIGS. 1A and 1B) minimal. In some embodiments, the laser source 222 is configured to emit a laser beam in different wavelength ranges, e.g., near infrared light (e.g., between about 800 nm and about 1100 nm), visible light (e.g., between about 400 nm and about 550 nm), ultraviolet light (e.g., between about 266 and 380 nm), and other suitable wavelengths. In some embodiments, the laser source 222 is an excimer laser, carbon dioxide laser or other suitable laser source. In some embodiments, the projection module 224 includes one or more lenses and mirrors configured to process the incident laser radiation and generate an output laser beam 226 with desired optical properties such as focus, power and profile.

The laser system 200 is configured to emit pulsed laser with high peak power and short pulse duration of less than one nanosecond. For example, the pulse duration is on the order of picoseconds or femtoseconds, e.g., between about 10 femtoseconds and about 100 picoseconds. In some embodiments, the pulse duration is between about 50 femtoseconds and about 10 picoseconds. In some embodiments, the pulse duration is less than about 1 picosecond, such as between about 100 femtoseconds and about 500 femtoseconds, and is referred to as femto-laser. In some embodiments, the pulse duration is less than about 10 picoseconds. The extremely short laser pulse duration, such as less than 1 picosecond, is useful in suppressing propagation of heat generated during the laser treatment. Heat propagation in a material layer of the photomask 200, such as the multilayer stack 104, generally requires a time duration on the order of nanoseconds or less depending upon the materials. In contrast, the pulse duration of the ultrafast laser on the order of tens of picoseconds or less is below the heat transfer time. Thus, laser-induced heat accumulated in the annealed material is reduced or eliminated due to the pauses after a single extremely short pulse or between consecutive pulses of the laser treatment. As a consequence, the ultrafast laser source 222 is capable of providing pulsed laser treatment with minimal excess heat accumulation in the treated Mo/Si layers and adjacent areas and thereby suppressing the heat-affected zones, in which the heat-affected zones contribute to the transition zones 104c. In some embodiments, the extremely short laser pulse duration is equal to or greater than about 50 femtoseconds. A laser pulse less than 50 femtoseconds given a predetermined laser source energy may lead to an unduly high average laser power, which may cause damage to the multilayer stack 104.

In some embodiments, the laser source 222 has different pulse configurations, e.g., a single pulse and a pulse train. The pulse train may be formed with a pulse frequency below about 20 MHz in cooperation with the pulse duration set forth above.

The laser system 220 is configured to emit a laser beam 226 through the projection module 224 with different power levels depending upon the material selected in the multilayer stack 104. With the ultra-short pulse duration, the laser system can generate a laser beam having relatively high intensity to enable ionization of atoms in the multilayer stack 104 through creation of electron-ion plasma that is localized to a focal volume. In an embodiment, during a laser treatment on the multilayer stack 104, a non-linear absorption effect occurs in which the atoms in the multilayer stack 104 absorb the laser energy and enter a stage of multiphoton ionization. The ionization phenomenon may lead to permanent structural change of the multilayer stack 104, such as refractive index change of the material occurring under a relatively low laser energy or the formation of a void (i.e., ablation) occurring under a relatively high laser energy. In some embodiments, the laser beam 226 is configured to cause the non-linear absorption effect to occur within the bulk of the multilayer stack 104, e.g., at interfaces between adjacent Mo and Si layers, rather than on the surface of the multilayer stack 104. Further, the laser beam 226 causes the atoms of the multilayer stack 104 to ionize while preventing these atoms from evaporating or being removed. The ionized atoms of the Mo/Si layers may aid in formation of compounds through inter-diffusion. In other words, the laser beam 226 is configured to provide an average intensity between the ionization energy and the ablation energy of the atoms in the multilayer stack 104. In an embodiment, the laser beam 226 is configured to provide an energy sufficient to break the Coulomb force bonding the atoms in the multilayer stack 104.

In some embodiments, the average laser power of the laser beam 226 is less than about 300 Watts, e.g., between about 80 Watts and about 300 Watts given the laser beam 226 being emitted at wavelengths of infrared radiation (IR), e.g., between about 700 nm and about 1 mm. The laser beam 226 may have a pulse energy equal to about 500 µJ or below given the laser beam 226 being emitted at wavelengths of infrared radiation.

In some embodiments, the parameters of the laser beam 226 further include a wavelength of the laser source 222. In some embodiments, the laser source 222 of green light in the wavelength between about 520 nm and 560 nm, such as 535 nm, with an average power between 0.025 Watts and about 0.05 Watts provides for formation of the molybdenum silicide in the second portion 104b of the multilayer stack 104. In some embodiments, the laser beam 226 with an average laser power greater than 0.05 Watts causes damage or ablation of the Mo and Si layers based on the laser source 222 as green light, and the laser beam 226 with an average laser power less than 0.025 Watts is insufficient to cause property change of the Mo and Si layers based on the laser source 222 as green light.

Referring to FIG. 2G, after the border regions 120 are formed, the photoresist layer 206 is removed. The removal operation may include an etching or ashing operation. The photomask 200 is thus completed. In some embodiments, the order of steps for the patterning of the absorption layer 108 in FIGS. 2A to 2D and the steps for forming the border regions 120 in FIGS. 2E to 2G may be changed.

Figure 3:
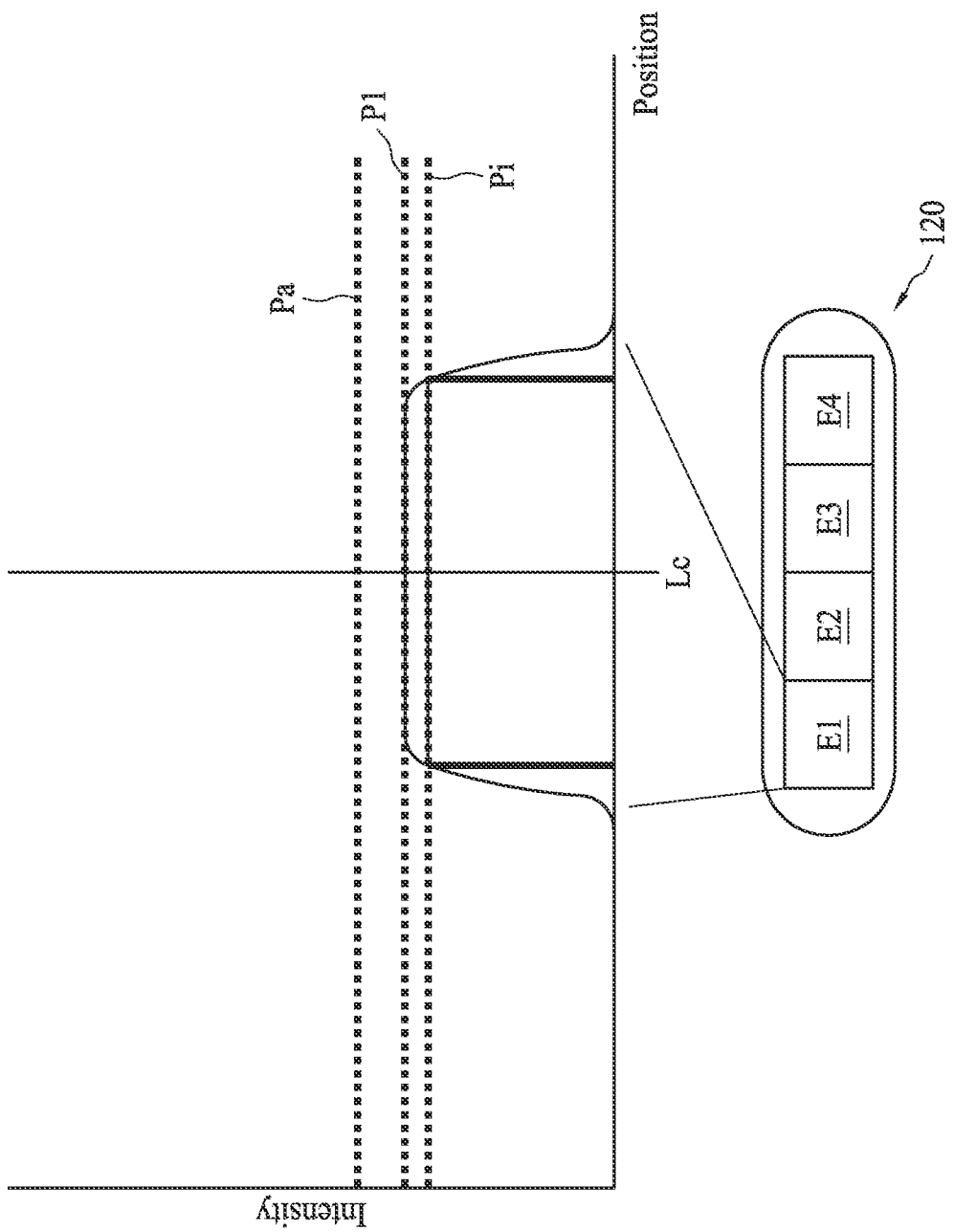
FIG. 3 is a schematic diagram of a laser beam profile, in accordance with some embodiments.

FIG. 3 is a schematic diagram of a laser beam profile, in accordance with some embodiments. The laser beam may be the laser beam 226 generated by the laser system 220. The laser beam profile is shown by its intensity levels with respect to the central position Lc of the laser beam 226, e.g., distance with respect to the center point Lc. In some embodiments, during the laser treatment, the border region 120 is treated by scanning using the laser beam 226 through a trajectory formed of the spots E1, E2, E3 and E4). The laser beam profile of the laser beam 226 may have a flattened top level P1, such as a rectangular shape, a trapezoidal shape, a top-hat shape or a mesa shape. In an embodiment, the beam profile has a substantially uniform distribution. In an embodiment, the beam profile having a top-hat shape or a mesa shape may be defined as including more than 70% of its intensity values at its peak value (P1) or close to the peak value (e.g., at least higher than 0.9*P1) across the entire distribution. In some embodiments, the planar peak of the beam profile with a steep slope on two sides is useful in limiting the majority of the beam intensity within the ablation threshold while minimizing the generation of heat-affected zones in the imaging region 110. In some embodiments, the heat-affected zone is one of the factors constituting the transition zone 104c. The reflection performance of the heat-affected zone or the transition zone 104c thus formed may be degraded as compared to a normal imaging region 110 and thus is deemed a waste of imaging areas. In an embodiment, the top level P1 of the laser beam intensity is set between an ionization energy Pi and an ablation energy Pa of the multilayer stack 104. As a result, the compounds of the Mo/Si layers can be formed from ionized Mo or Si particles without adverse effects of the ablation.

According to an embodiment of the present disclosure, the proposed ultrafast pulsed laser with pulse duration of less than 50 picoseconds produces a border region 120 with a reflectivity value less than 0.05% and a width of the transition zone 104c between about 5 μm and 10 μm, such as 9 μm, using a Gaussian distribution beam profile. In other embodiments, the performance of the transition zone 104c using the ultrafast pulsed laser with a top-hat beam profile is between about 1 μm and about 5 μm, such as 2 μm, and outperforms that using the Gaussian-distribution beam profile.

Figure 4:
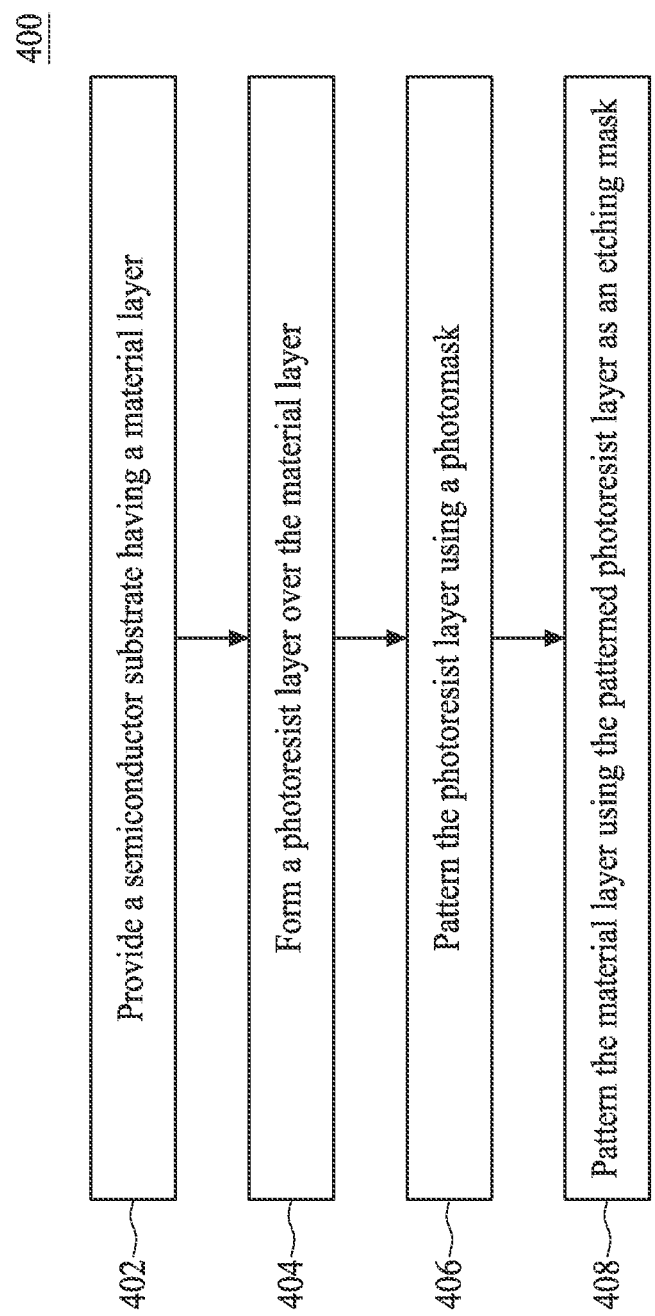
FIG. 4 is a flowchart of a method of manufacturing a semiconductor device, in accordance with some embodiments.

FIG. 4 is a flowchart 400 of a method of manufacturing a semiconductor device, in accordance with some embodiments. The semiconductor device may be manufactured using an EUV mask, such as the photomasks 100 and 200 described in relation to FIGS. 1A, 1B, and 2A to 2G. The method 400 begins at step 402, wherein a semiconductor substrate having a material layer is provided. The semiconductor substrate includes a semiconductor material such as silicon. In some embodiments, the semiconductor substrate may include other semiconductor materials, such as silicon germanium, silicon carbide, gallium arsenide, or the like. In some embodiments, the semiconductor substrate is a p-type semiconductive substrate (acceptor type) or n-type semiconductive substrate (donor type). Alternatively, the semiconductor substrate includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the semiconductor substrate is a semiconductor-on-insulator (SOI) substrate. In other alternatives, the semiconductor substrate may include a doped epitaxial layer, a gradient semiconductor layer, and/or a semiconductor layer overlaying another semiconductor layer of a different type, such as a silicon layer on a silicon germanium layer.

In some embodiments, the material layer may be a semiconductor layer, a dielectric layer or a conductive layer. In some embodiments, the material layer may be embedded in the semiconductor substrate or deposited over the semiconductor substrate. The material layer may be formed of a single layer or may include a multilayer structure.

At step 404 a photoresist layer is formed over the material layer. The photoresist layer may be formed over the material layer by CVD, PVD, ALD, spin-on coating, or other suitable film-forming method. Next, the method 400 continues with step 406, in which the photoresist layer is patterned by using a photomask, such as the EUV photomask 100 and 200 as described above, in a lithography operation. In an embodiment, the photomask 100 or 200 may be disposed on a reticle stage of a lithography system and the semiconductor substrate is disposed on a wafer stage. The lithography operation may involve projection of a patterned exposure radiation onto the photoresist layer through transmission or reflection of the photomask 100 or 200. Portions of the photoresist layer may be removed after the lithography operation.

The method 400 continues with step 408 to pattern the material layer using the patterned photoresist layer as an etch mask. Next, the photoresist layer is removed. The removal operations may include an etching or ashing operation.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

According to an embodiment, a method includes: providing a substrate; depositing a reflective layer over the substrate; depositing a capping layer over the reflective layer; depositing an absorption layer over the capping layer; and treating the reflective layer by a laser beam to form a border region. The borderer region has a reflectivity less than about 0.1%.

According to an embodiment, a method of manufacturing a photomask includes: providing a substrate; depositing a multilayer stack including Mo/Si layers over the substrate, the multilayer stack including a first portion and a second portion circumscribing the first portion; depositing a capping layer over the multilayer stack; forming an absorption layer over the capping layer; and performing a treatment on the second portion using a laser beam to form molybdenum silicide in the second portion. The second portion has a reflectivity less than that of the first portion.

According to an embodiment, a photomask includes a substrate and a multilayer stack over the substrate, wherein the multilayer stack is configured to reflect a patterning radiation, includes alternating molybdenum layers and silicon layers, and includes a first area and a second area laterally surrounding the first area. The second area comprising a thickness less than a thickness of the first area.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a substrate;
   depositing a reflective layer over the substrate;
   depositing a capping layer over the reflective layer;
   depositing an absorption layer over the capping layer; and
   treating the reflective layer by a laser beam to form a border region, wherein the borderer region has a reflectivity less than about 0.1%.

2. The method according to claim 1, wherein the treating of the reflective layer causes a thickness of the border region to be less than a thickness of a remaining portion in the reflective layer.

3. The method according to claim 1, wherein the treating of the reflective layer causes the capping layer and the absorption layer to have substantially same thicknesses during the treating of the reflective layer.

4. The method according to claim 1, wherein the depositing of the reflective layer comprises alternatingly depositing molybdenum layers and silicon layers.

5. The method according to claim 1, wherein the treating of the reflective layer to form a border region comprises forming molybdenum silicide in the border region.

6. The method according to claim 1, wherein the laser beam comprises a beam profile having a top-hat shape.

7. The method according to claim 1, wherein the treating of the reflective layer comprises forming a transition zone adjacent to the border region, the transition zone comprising a reflectivity value between about 0.05% and about 60%.

8. The method according to claim 7, wherein a width ratio between the transition zone and the border region is between about 0.01 and about 0.05.

9. The method according to claim 1, further comprising patterning the absorption layer by etching through a portion of the absorption layer and exposing the capping layer.

10. The method according to claim 1, wherein the border region comprises a rectangular ring shape from a top-view perspective.

11. A method of manufacturing a photomask, comprising:
    providing a substrate;
    depositing a multilayer stack comprising Mo/Si layers over the substrate, the multilayer stack comprising a first portion and a second portion circumscribing the first portion;
    depositing a capping layer over the multilayer stack;
    forming an absorption layer over the capping layer; and
    performing a treatment on the second portion using a laser beam to form molybdenum silicide in the second portion, wherein the second portion has a reflectivity less than that of the first portion.

12. The method according to claim 11, wherein the performing of the treatment on the second portion comprises controlling a beam intensity of the laser beam to be higher than an ionization energy of the Mo/Si layers.

13. The method according to claim 11, wherein the performing of the treatment on the second portion comprises forming a recess on a surface of the absorption layer, the recess following a pattern of the second portion.

14. The method according to claim 11, wherein the laser beam has a pulse duration between about 50 femtoseconds and about 10 picoseconds.

15. The method according to claim 11, wherein the forming of the absorption layer comprises patterning the absorption layer, the method further comprising forming an antireflective layer over the absorption layer, the antireflective layer following a pattern of the absorption layer.

16. A photomask, comprising:
    a substrate; and
    a multilayer stack over the substrate, wherein the multilayer stack is configured to reflect a patterning radiation, comprises alternating molybdenum layers and silicon layers, and includes a first area and a second area laterally surrounding the first area, the second area comprising a thickness less than a thickness of the first area.

17. The photomask according to claim 16, further comprising:
    a cap layer over the multilayer stack; and
    an absorption layer over the cap layer, wherein the absorption layer comprises a circuit pattern and a portion of the cap layer is exposed through the circuit pattern.

18. The photomask according to claim 16, wherein the second area comprises molybdenum silicide.

19. The photomask according to claim 16, wherein the second area has a reflectivity value less than a reflectivity value of the first area with respect to extreme ultraviolet.

20. The photomask according to claim 19, wherein the multilayer stack further includes a third area between the first area and the second area, and the third area comprises a reflectivity value between about 0.05% and about 60% with respect to extreme ultraviolet.

* * * * *